United States Patent [19]

Hagino

[11] Patent Number: 5,084,401
[45] Date of Patent: Jan. 28, 1992

[54] INSULATED GATE BIPOLAR TRANSISTOR AND METHOD OF MANUFACTURING THE SAME

[75] Inventor: Hiroyasu Hagino, Itami, Japan

[73] Assignee: Mitsubishi Denki Kabushiki Kaisha, Tokyo, Japan

[21] Appl. No.: 627,870

[22] Filed: Dec. 17, 1990

Related U.S. Application Data

[62] Division of Ser. No. 341,629, Apr. 21, 1989, Pat. No. 4,990,975.

[30] Foreign Application Priority Data

Dec. 16, 1988 [JP] Japan ................. 63-318943

[51] Int. Cl.$^5$ .......................................... H01L 21/265
[52] U.S. Cl. .................................... 437/31; 437/149; 437/150; 437/152; 437/30; 437/41; 437/27; 437/154
[58] Field of Search ............... 437/31, 149, 150, 154, 437/911, 151, 30, 41, 27; 357/23.4

[56] References Cited

U.S. PATENT DOCUMENTS

| | | | |
|---|---|---|---|
| 4,777,149 | 10/1988 | Tanabe et al. | 437/142 |
| 4,810,665 | 3/1989 | Chang et al. | 357/23.4 |
| 4,985,743 | 1/1991 | Tokura et al. | 357/23.4 |

Primary Examiner—Brian E. Hearn
Assistant Examiner—Tuan Nguyen
Attorney, Agent, or Firm—Oblon, Spivak, McClelland, Maier & Neustadt

[57] ABSTRACT

A P-type base region, which is formed on an N-type body layer, as a relatively deep first base region and a relatively shallow second base region. An N+-type emitter region is formed on the base region. A portion of the surface of the second base region between surfaces of the emitter region and body layer is defined as a channel. A gate oxide film, on which a gate electrode is formed, is provided on the channel. The amount and depth of introduction of an impurity in the second base region is about $2 \times 10^{14}$ to $5 \times 10^{14}$ cm$^{-2}$ and 4 to 10 μm, respectively. The thickness of the gate oxide film is about 600 to 1000 Å. Thus, an IGBT is implemented, which can ensure sufficient pulse energization ability while causing no latch-up in application to a stroboscope circuit.

2 Claims, 8 Drawing Sheets

INSULATED GATE BIPOLAR TRANSISTOR AND METHOD OF MANUFACTURING THE SAME

This is a division, of application Ser. No. 07/341,629, filed on 04/21/89, now U.S. Pat. No. 4,990,975.

BACKGROUND OF THE INVENTION

1. Field of the Invention

The present invention relates to an insulated gate bipolar transistor (hereinafter referred to as IGBT), and more particularly, it relates to the structure of an IGBT which is suitably applied to a stroboscope and a method of manufacturing the same.

2. Description of the Background Art

In the field of a stroboscope, a system employing a self-arc-suppressing type element has been recently studied in place of a conventional thyristor system requiring a commutation circuit. Within such self-arc-suppressing type elements, particularly studied is a voltage-driven type IGBT, which can simplify a driving circuit and have high current capacity. However, a generally developed IGBT has been suitable for an inverter. An IGBT employed for an inverter is generally in non-latch type structure, in which main current enters a saturation region below latch-up current in order to effectuate self current limitation upon shorting. Thus, the generally developed IGBT is insuitable for a stroboscope. Such a problem will be described hereinafter in detail.

FIG. 1 is a sectional view showing basic structure of a conventional N-channel IGBT. Referring to FIG. 1, a P⁻-type semiconductor substrate 1 of relatively low specific resistance, which serves as a collector layer, is provided on one major surface thereof with an N⁺-type buffer layer 2 of relatively low specific resistance for suppressing injection of positive holes from the collector layer 1, and an N-type body layer 3 of relatively high specific resistance is formed on the N⁺-type buffer layer 2. A plurality of P-type base regions 4 are formed on the surface of the N-type body layer 3 by selectively introducing a P-type impurity in accordance with a prescribed pattern, and N⁺-type emitter regions 5 of relatively low specific resistance are formed on the surfaces of the P-type base regions 4 by selectively introducing an N-type impurity. Surface parts 6 of the P-type base regions 4 held between the N⁺-type emitter regions 5 and the N-type body layer 3 are defined as channel regions. A gate electrode 8 is provided on the channel regions 6 through a gate oxide film 7. Emitter electrodes 9 having emitter-short structure for preventing a latch-up phenomenon are formed on the N⁺-type emitter regions 5 and the P-type base regions 4, and a collector electrode 10 is formed on the rear surface of the P⁺-type collector layer 1.

In a general IGBT, a P-type region (P⁺-type collector layer 1 in FIG. 1) is basically provided on a drain side of a vertical MOS-FET. In operation, the P⁺-type collector layer 1 injects holes into the N-type body layer 3 through the N⁺-type buffer layer 2 to cause modulation with electrons injected from the N⁺-type emitter regions 5 through the channels 6 formed by application of voltage to the gate 8, to thereby extremely reduce resistance of the N-type body layer 3 (conductivity modulation effect). Resistance of the N-type body layer 3, which is a main cause for increase in ON resistance of a MOS-FET of high breakdown voltage, is thus extremely reduced, whereby the IGBT, which is a voltage control type element similarly to the MOS-FET, can implement high current capacity as compared with the MOS-FET, even if the same is formed as an element of high breakdown voltage.

In the IGBT, however, a parasitic thyristor is defined by the N⁺-type emitter regions 5, the P-type base regions 4, the N-type body layer 3 and the P⁺-type collector layer 1, as understood from FIG. 1. When main current (collector current) flowing in the IGBT is increased, hole current flowing from the N-type body layer 3 into the P-type base regions 4 is also increased. This hole current serves as gate current for the parasitic thyristor, which is turned on when the gate current exceeds a certain limit. Once the parasitic thyristor enters an ON state, it is impossible to control the main current by gate voltage which is applied to the gate 8 (e.i., latch-up phenomenon), to lead to breakdown of the element.

FIG. 2 is a graph showing $I_C$-$V_{CE}$ output characteristics of the IGBT. Symbol $I_C$ represents collector current and symbol $V_{CE}$ represents collector-to-emitter voltage. Both of the collector current $I_C$ and the collector-to-emitter voltage $V_{CE}$ are at normalized values. As obvious from FIG. 2, self current limitation is caused under constant gate voltage $V_G$ similarly to the case of the MOS-FET, whereby the collector current $I_C$ is not increased in excess of saturation current $I_{C(sat)}$. Thus, when latch-up current $I_L$ is higher than maximum saturation current $I_{C(sat)4}$ in a prescribed gate voltage range $V_{G1}$ to $V_{G4}$ as shown by a dotted line in FIG. 2, no latch-up phenomenon can take place in such a gate voltage range. Thus, an IGBT of non-latch structure is implemented.

The latch-up phenomenon has been thus prevented in the conventional IGBT. The latch-up current $I_L$, which depends on the structure of the IGBT, is generally about hundreds of amperes per cm² in an IGBT developed for an inverter. In order to implement an IGBT of non-latch structure, therefore, the saturation current $I_{C(sat)}$ must be suppressed to be not more than hundreds of amperes per cm² in a working gate voltage range. On the other hand, pulse energization ability of desirably at least 1000 A/cm² is required for an IGBT for a stroboscope. Thus, if a stroboscope is formed by using an IGBT whose saturation current $I_{C(sat)}$ is suppressed as hereinabove described, a problem is caused in insufficient pulse energization ability.

SUMMARY OF THE INVENTION

An insulated gate bipolar transistor according to the present invention comprises a first conductivity type first semiconductor layer having first and second major surfaces, a second conductivity type second semiconductor layer formed on the first major surface of the first semiconductor layer, a first conductivity type well region formed on the second semiconductor layer, the well region comprising a relatively deep first semiconductor region and a relatively shallow second semiconductor region which are adjacent to each other, the second semiconductor region having an impurity dose amount of about $2 \times 10^{14}$ to $5 \times 10^{14}$ cm⁻² and a depth of about 4 to 10 μm, a second conductivity type third semiconductor region formed on the well region, an oxide film formed on a portion of a surface of the second semiconductor region between surfaces of the third semiconductor region and the second semiconductor layer, the oxide film having a thickness of about 600 to 1000 Å, a control electrode formed on the oxide film, a first electrode formed on the third semiconductor region, and a second electrode formed on the second major surface of the first semiconductor layer.

A method of manufacturing an insulated gate bipolar transistor according to the present invention comprises the steps of preparing a first conductivity type first semiconductor layer having first and second major surfaces, forming a second conductivity type second semiconductor layer on the first major surface of the first semiconductor layer, selectively introducing a first conductivity type impurity into the second semiconductor layer to form a relatively deep first conductivity type first semiconductor region on the second semiconductor layer, forming an oxide film having a thickness of about 600 to 1000 Å on the second semiconductor layer and the first semiconductor region, forming a conductor layer on the oxide film, patterning the oxide film and the conductor layer to define a window, introducing a first conductivity type impurity into the second semiconductor layer in an impurity dose amount of about $2 \times 10^{14}$ to $5 \times 10^{14}$ cm$^{-2}$ through the window to form a first conductivity type second semiconductor region having relatively shallow depth of about 4 to 10 μm, the first and second semiconductor regions being adjacent to each other and integrated to form a first conductivity type well region, selectively introducing a second conductivity type impurity into the well region through the window to form a second conductivity type third semiconductor region on the well region, selectively removing the oxide film and the conductor layer while at least leaving portions thereof on a portion of a surface of the second semiconductor region between surfaces of the third semiconductor region and the second semiconductor layer, forming a first electrode on the third semiconductor region, and forming a second electrode on the second major surface of the first semiconductor layer.

According to the present invention, the amount and depth of introduction of an impurity in a second semiconductor region, in which a channel is formed, are set in ranges of about $2 \times 10^{14}$ to $5 \times 10^{14}$ cm$^{-2}$ and 4 to 10 μm, respectively, while the thickness of an oxide film for insulating a control electrode is set in a range of about 600 to 1000 Å, to thereby implement an IGBT which can ensure sufficient pulse energization ability while causing no latchup phenomenon in application to a stroboscope circuit.

Accordingly, an object of the present invention is to provide an IGBT which has sufficient pulse energization ability and is suitable for a stroboscope, and a method of manufacturing the same.

These and other objects, features, aspects and advantages of the present invention will become more apparent from the following detailed description of the present invention when taken in conjunction with the accompanying drawings.

DETAILED DESCRIPTION OF THE PREFERRED EMBODIMENTS

Figure 1:
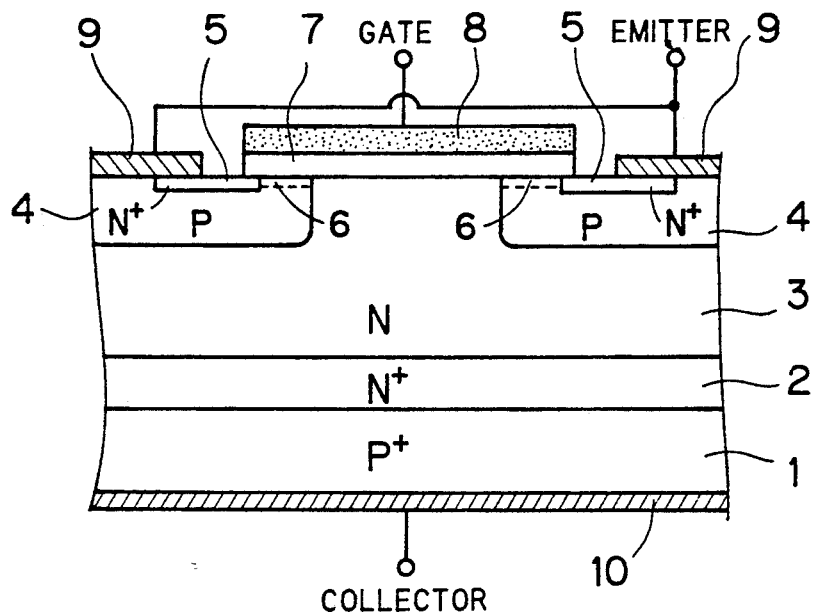
FIG. 1 is a sectional view showing basic structure of a conventional N-channel IGBT.
Figure 2:
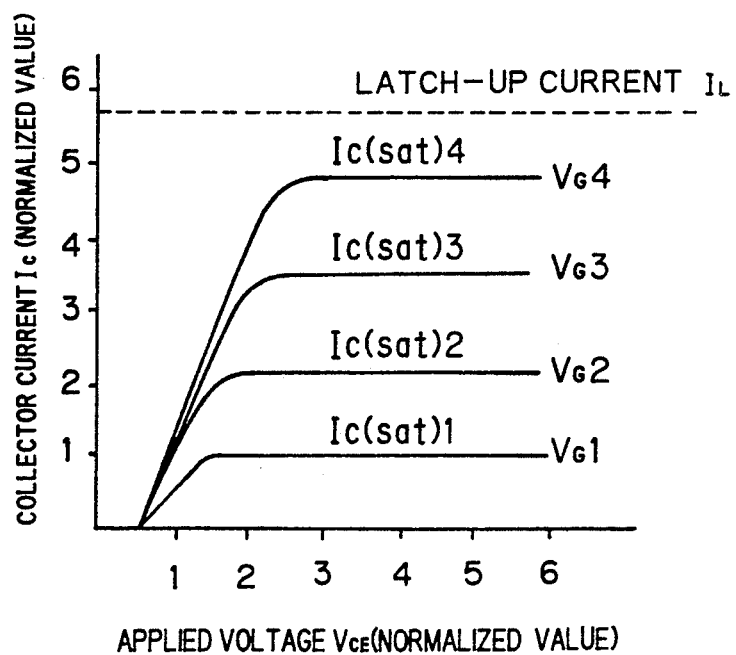
FIG. 2 is a graph showing output characteristics of a conventional IGBT.
Figure 3:
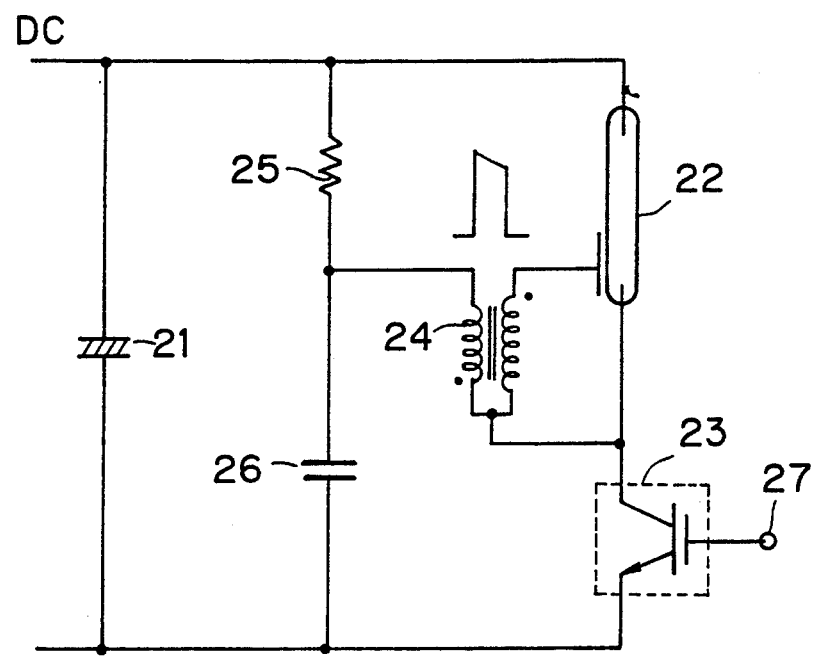
FIG. 3 is a circuit diagram showing a basic circuit of a stroboscope to which an IGBT according to the present invention is applied.

FIG. 3 is a circuit diagram showing a basic circuit of a stroboscope to which an IGBT according to the present invention is applied. A xenon tube 22 and an IGBT 23 are connected in series with both ends of a power capacitor 21, which is charged by a DC power source. A trigger terminal of the xenon tube 22 is connected to a secondary side of a trigger transformer 24, whose primary side is connected to a capacitor 26 which is charged through a resistor 25.

When the IGBT 23 is turned on in response to voltage applied to a gate terminal 27, voltage charged in the capacitor 26 is discharged through the trigger transformer 24 and the IGBT 23, whereby a high voltage pulse is generated in the secondary side of the trigger transformer 24. The xenon tube 22 is triggered by the high voltage pulse and the voltage charged in the power capacitor 21 is discharged through the xenon tube 22 and the IGBT 23, whereby the xenon tube 22 emits light.

In this stroboscope circuit, main current (collector current) flowing in the IGBT 23 is limited by load resistance of the xenon tube 22. Thus, the IGBT 23 is so designed that its latch-up current value exceeds the main current value limited by the xenon tube 22, whereby absolutely no latch-up phenomenon is caused in the IGBT 23 regardless of the value of its saturation current. In order to save source power, it is preferable to reduce power loss to the minimum in emission. In this point of view, the saturation current of the IGBT 23 is preferably as large as possible. The present invention provides an IGBT which is suitable for such use.

Figure 4:
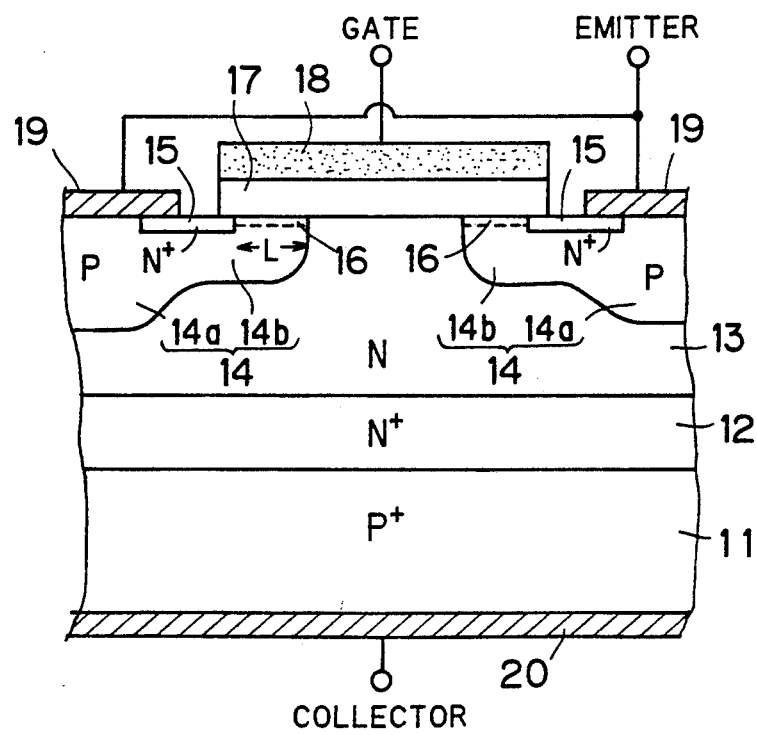
FIG. 4 is a sectional view showing the structure of an embodiment of an IGBT according to the present invention.

FIG. 4 is a sectional view showing the structure of an embodiment of an IGBT according to the present invention. Referring to FIG. 4, a collector layer 11 is formed by a P+-type semiconductor substrate having relatively low specific resistance of about 0.05 to 0.002 Ω.cm. An N+-type buffer layer 12 is provided on the collector layer 11 for suppressing injection of holes from the collector layer 11, and an N-type body layer 13 of relatively high specific resistance is provided on the N+-type buffer layer 12. A plurality of P-type well regions, i.e., P-type base regions 14, each of which is formed by a relatively deep first P-type base region 14a and a relatively shallow second P-type base region 14b, are selectively formed on the N-type body layer 13. N+-type emitter regions 15 of relatively low specific resistance are selectively formed on the P-type base regions 14. Portions 16 of surfaces of the second P-type base regions 14b held between surfaces of the N+-type emitter regions 15 and the N-type body layer 13 are defined as channel regions. A gate electrode 18 is provided on the channel regions 16 with a gate oxide film 17 interposed between them. Emitter electrodes 19 having emitter-shorted structure for preventing a latch-up phenomenon are formed on the N+-type emitter regions 15 and the first P-type base regions 14a, while a collector electrode 20 is formed on the rear surface of the P$^+$-type collector layer 11.

In the following, description will be made with reference to latch-up current density $J_L$, saturation current density $J_{C(sat)}$, threshold voltage $V_{G(th)}$ and gate breakdown voltage $V_{G(BK)}$, within various characteristics of the IGBT shown in FIG. 4. These characteristics are defined as follows:

Latch-up current density $J_L$: main current density at which the IGBT enters a latch-up state Saturation current density $J_{C(sat)}$: density of the maximum main current which can flow in a state of application of certain gate voltage Threshold voltage $V_{G(th)}$: gate voltage required to turn on the IGBT Gate breakdown voltage $V_{G(BK)}$: critical value of gate voltage causing breakdown of the gate oxide film Assuming that gate voltage $V_G$ applied to an IGBT for a stroboscope is within a range of 25±5 V, the gate breakdown voltage $V_{G(BK)}$ must be at least 30 V, and the threshold voltage $V_{G(th)}$ is preferably not more than about 5 V. In view of supply of large current suitable for high intensity emission with minimum power loss, it is preferable that the latch-up current density $J_L$ is at least about 1000 A/cm$^2$ and the saturation current density $J_{C(sat)}$ is higher than the latch-up current density $J_L$ in the aforementioned gate voltage range (25±5 V). Conditions for implementing an IGBT having such characteristics will now be considered.

Figure 5:
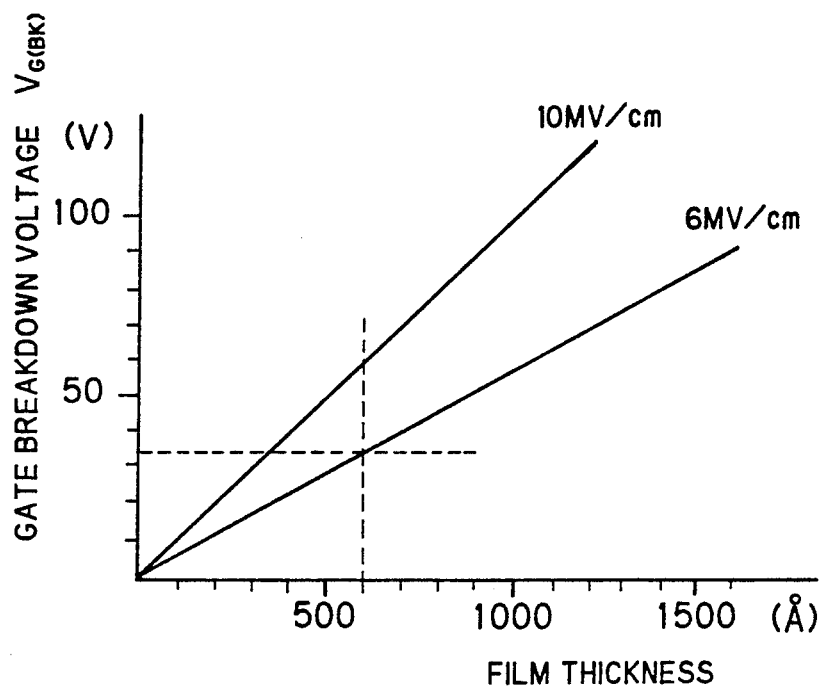
FIGS. 5 to 12 are graphs for illustrating respective factors determining principal characteristics of the IGBT.

The gate breakdown voltage $V_{G(BK)}$ depends on the thickness of the gate oxide film 17. FIG. 5 is a graph showing relation between the thickness of the gate oxide film 17 of SiO$_2$ and the gate breakdown voltage $V_{G(BK)}$. A dielectric breakdown electric field of an SiO$_2$ film, which is formed by a general process of manufacturing a MOS transistor, is within a range of about 6 MV/cm to 10 MV/cm (8 MV/cm in average). Since gate voltage $V_G$ applied in use for a stroboscope is generally within a range of 20 to 30 V as hereinabove described, the thickness of the gate oxide film 17 must be in excess of about 6000 Å in order to attain the gate breakdown voltage $V_{G(BK)}$ of at least 30 V, in consideration of dispersion in manufacturing. The thickness of the gate oxide film 17 also exerts influence on the threshold voltage $V_{G(th)}$, as hereinafter considered.

Figure 6:
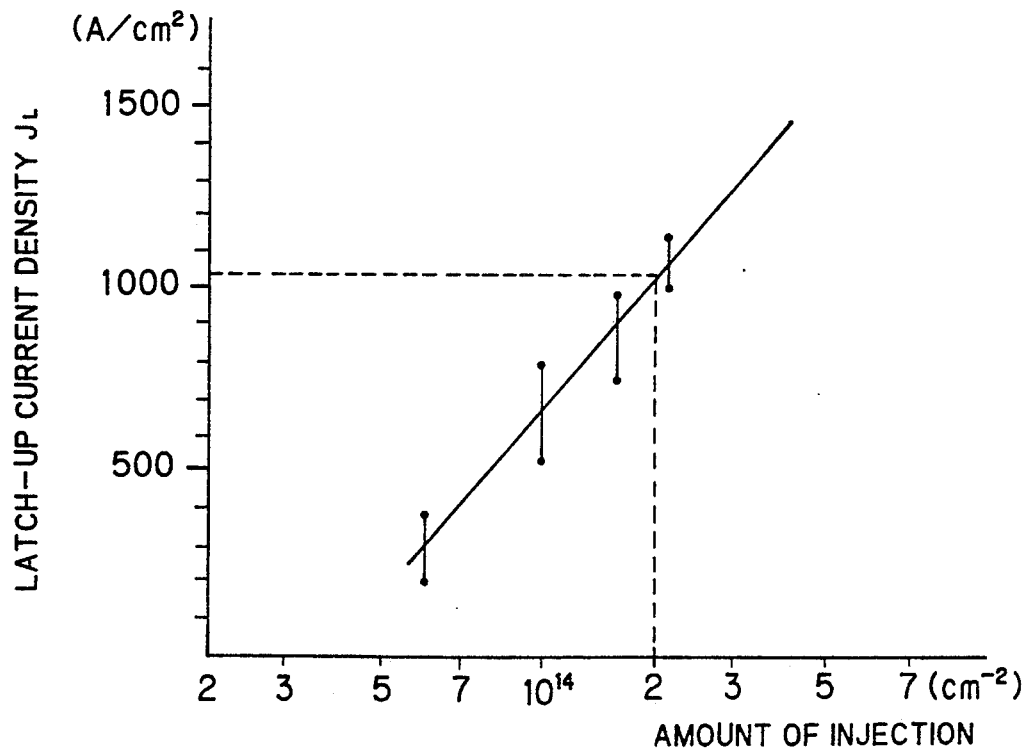
Figure 7:
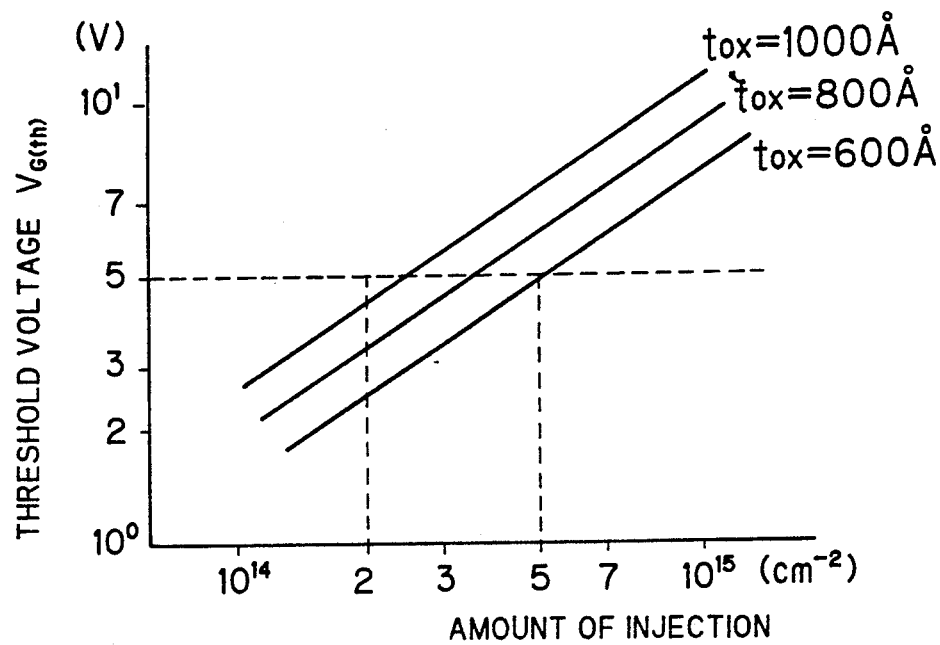
Figure 8:
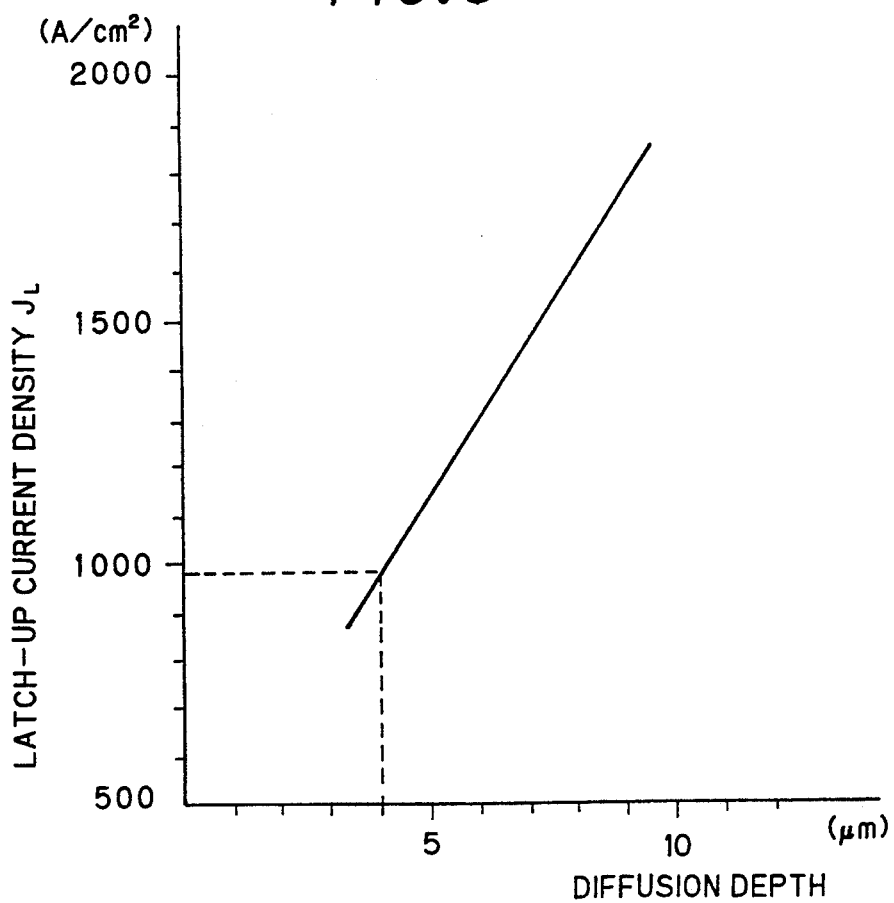
Figure 9:
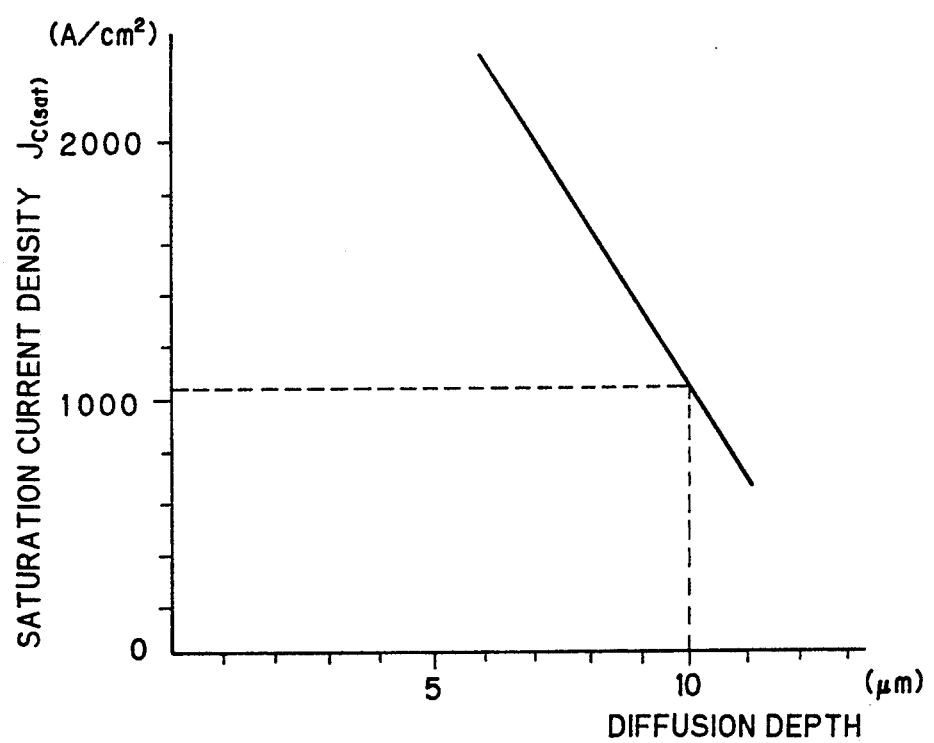

Impurity concentration and diffusion depth of each second P-type base region 14b, on the surface of which the channel region 16 is defined, must be correctly controlled since they exert strong influence on the latch-up current density $J_L$, the saturation current density $J_{C(sat)}$ and the threshold voltage $V_{G(th)}$. FIG. 6 is a graph showing relation between the amount of impurity injection in the second P-type base region 14b and the latch-up current density $J_L$; FIG. 7 is a graph showing relation between the amount of impurity injection in the second P-type base region 14b and the threshold voltage $V_{G(th)}$ with a parameter of thickness $t_{OX}$ of the gate oxide film 17; FIG. 8 is a graph showing relation between diffusion depth of the second P-type base region 14b and the latch-up current density $J_L$ and FIG. 9 is a graph showing relation between diffusion depth of the second P-type base region 14b and the saturation current density $J_{C(sat)}$ assuming that the gate voltage $V_G$ is 20 V. As shown in to FIG. 9, the saturation current density $J_{C(sat)}$ is reduced with increase in diffusion depth of the second P-type base region 14b mainly because of increase in channel resistance caused by increase in channel length L defiend in FIG. 4.

Referring to FIG. 6, it is understood that the amount of impurity injection in the second P-type base region 14b must be at least about $2 \times 10^{14}$ cm$^{-2}$ in order to obtain latch-up current density exceeding 1000 A/cm$^2$. Referring to FIG. 7, it is understood that the amount of impurity injection in the second P-type base region 14b must be not more than about $5 \times 10^{14}$ cm$^{-2}$ in consideration of conditions (i) the amount of impurity injection in the second P-type base region 14b is at least $2 \times 10^{14}$ cm$^{-2}$; (ii) the thickness $t_{OX}$ of the gate oxide film 17 is at least 600 Å; and (iii) the threshold voltage $V_{G(th)}$ is not more than 5 V. In view of this and the above condition (i), the amount of impurity injection in the second P-type base region 14b is preferably within a range of $2 \times 10^{14}$ to $5 \times 10^{14}$ cm$^{-2}$. As shown in FIG. 7, the threshold voltage $V_{G(th)}$ is also varied with change in the thickness $t_{OX}$ of the gate oxide film 17. It is understood that the thickness $t_{OX}$ of the gate oxide film 17 must be not more than about 1000 Å in consideration of the conditions (i) to (iii).

Referring to FIG. 8, it is understood that the diffusion depth of the second P-type base region 14b must be at least about 4 μm in order to obtain the latch-up current density $J_L$ of at least 1000 A/cm$^2$. Referring to FIG. 9, it is understood that the diffusion depth of the second P-type base region 14b must be not more than about 10 μm in order to obtain the saturation current density of at least 1000 A/cm$^2$. In other words, the diffusion depth of the second P-type base region 14b must be within a range of 4 to 10 μm.

Figure 10:
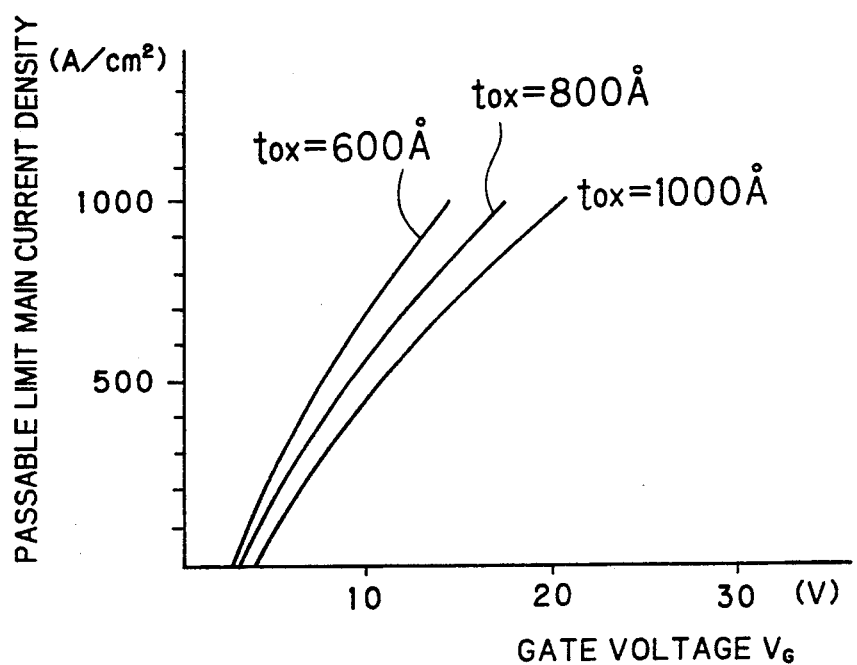

In view of the above consideration, it is preferable that the thickness of the gate oxide film 17 is within a range of about 600 to 1000 Å and the amount of impurity injection in the second P-type base region 14b is within a range of about $2 \times 10^{14}$ to $5 \times 10^{14}$ cm$^{-2}$ while the diffusion depth of the second P-type base region 14b is within a range of about 4 to 10 μm, in order to provide an IGBT suitable for a stroboscope. FIG. 10 is a graph showing the state of change of maximum passable main current density (passable limit main current density) upon application of different gate voltage levels $V_G$ to a specific IGBT satisfying such conditions, with a parameter of the gate oxide film thickness $t_{OX}$. When the above conditions are satisfied, the latch-up current density is assumed to be set in excess of 1000 A/cm$^2$, and hence an passable limit below 1000 A/cm$^2$ is caused by saturation in the graph of FIG. 10. As obvious from extension of the graph shown in FIG. 10, saturation current density is far beyond 1000 A/cm$^2$ with the gate voltage $V_G$ in a range of 20 to 30 V. Therefore, it is readily possible to set the saturation current density $J_{C(sat)}$ to be higher than the latch-up current density $J_L$ in the gate voltage range of 20 to 30 V.

Figure 11:
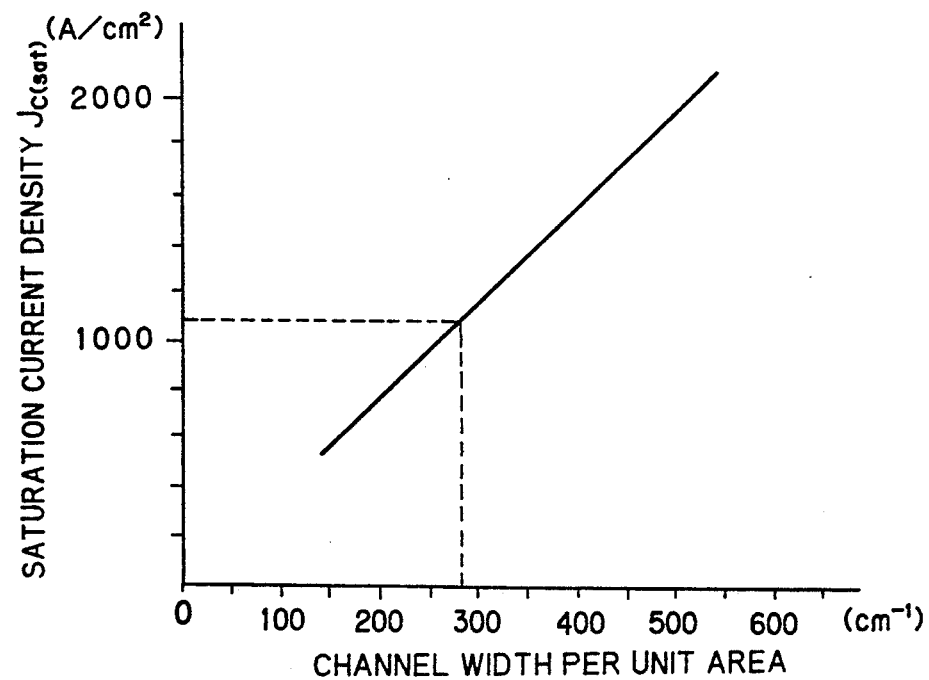

Since the load (i.e., xenon tube 22) serves as a current limiting member in the IGBT circuit for a stroboscope as herienabove described, it is not necessary to design the saturation current density $J_{C(sat)}$ to be lower than the latch-up current density $J_L$ to attain non-latch structure dissimilarly to the case of application to an inverter, but the saturation current density $J_{C(sat)}$ is rather set as large as possible in consideration of improvement in luminous efficacy of the xenon tube. One of great factors which determine the saturation current density $J_{C(sat)}$ is channel width. FIG. 11 is a graph showing relation between channel width per unit area and the saturation current density $J_{C(sat)}$, assuming that the gate voltage $V_G$ is 20 V. It is understood that the channel width per unit area must be at least about 300 cm$^{-1}$, in order to obtain the saturation current density $J_{C(sat)}$ of at least 1000 A/cm$^2$.

As is well known in the art, a latch-up phenomenon is easily caused in the IGBT when a current amplification factor α of a transistor formed by the P$^+$-type collecto layer 11, the N-type body layer 13 and the P-type base region 14 is too much increased to excessively approach "1". Further, when hole injection efficiency from the P$^+$-type collector layer 11 to the N-type body layer 13 is increased in order to increase the current amplification factor α, the switching speed is decreased. When the current amplification factor α is too much decreased, on the other hand, power loss is extremely increased by increase in saturation voltage. Thus, it is preferable to sufficiently control the current amplification factor α. In an IGBT for an inverter, the current amplification factor α is set at about 0.3 to 0.5 in order to ensure a sufficient switching speed. In an IGBT for a stroboscope, however, a high switching speed is not required since the stroboscope has an extremely long emission interval, but it is rather preferable to reduce power loss to the minimum. In the IGBT for a stroboscope, therefore, the current amplification factor α is preferably about 0.8 to 0.9 in a main current density range of about 100 to 1000 A/cm$^2$.

Figure 12:
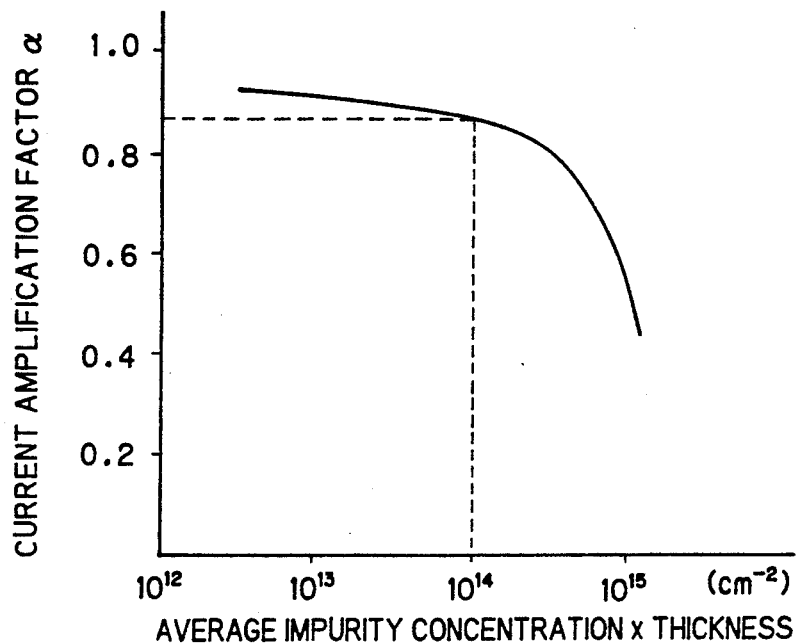

As shown in FIG. 12, the current amplification factor α is varied with impurity concentration of the N$^+$-type buffer layer 12. Referring to FIG. 12, the horizontal axis indicates the product CT (cm$^{-2}$) of average impurity concentration C and thickness T of the N$^+$-type buffer layer 12, and the vertical axis indicates the current amplification factor α. As the product CT is increased, the current amplification factor α is decreased since the hole injection efficiency from the P$^+$-type collector layer 11 to the N-type body layer 13 is decreased. It is understood that the product CT may be about 10$^{14}$ cm$^{-2}$, in order to obtain the current amplification factor α of about 0.8 to 0.9.

It is not necessary to strictly control the thickness and resistivity of the N-type body layer 13 dissimilarly to the case of MOS-FET, since the resistivity thereof is extremely reduced by a conductivity modulation effect in active state of the IGBT, as hereinabove described. In general, the N-type body layer 13 may be about 20 to 30 Ω.cm in resistivity and about 50 μm in thickness, in the case of a product having rated voltage of 500 V.

Figure 13A:
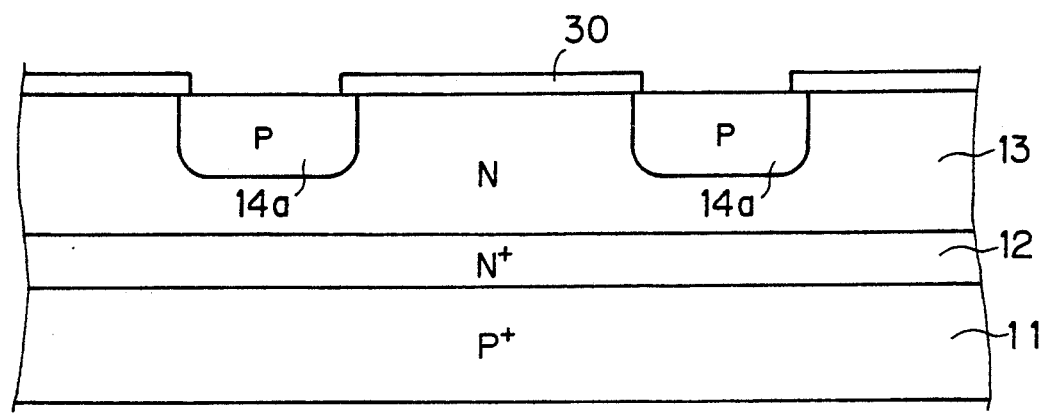
FIG. 13A to FIG. 13C are a sectional views showing the procedure for manufacturing the IGBT shown in FIG. 4.
Figure 13B:
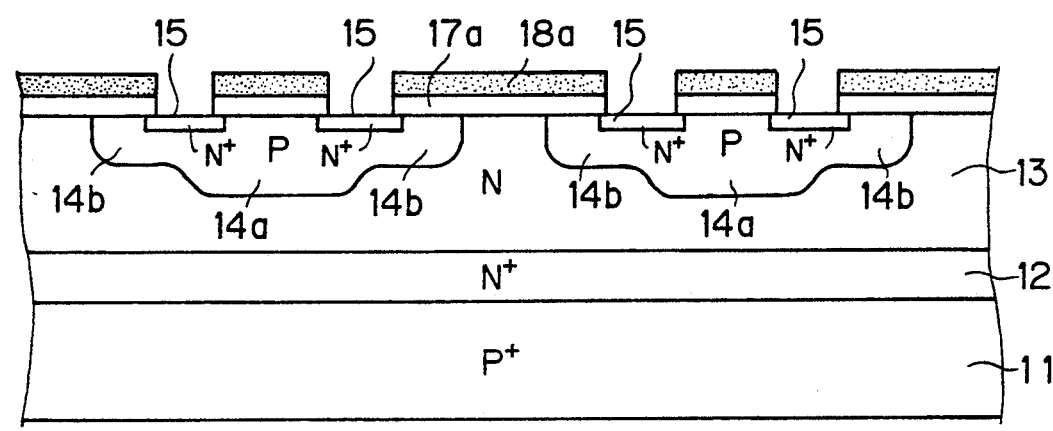
Figure 13C:
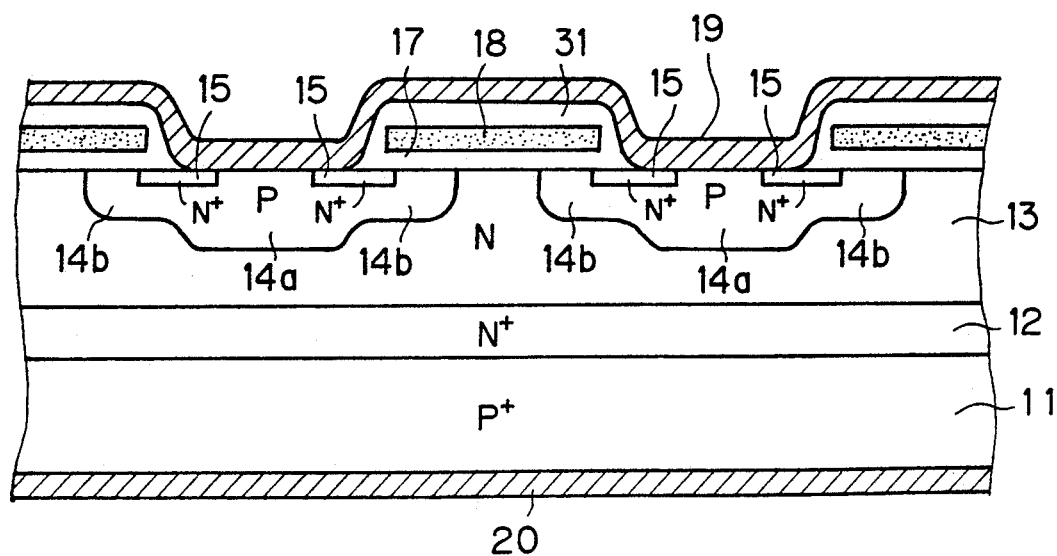

FIG. 13A to FIG. 13C are sectional views showing the procedure of manufacturing the IGBT shown in FIG. 4. With reference to FIG. 13A to FIG. 13C, the procedure of manufacturing the IGBT shown in FIG. 4 will now be described.

First, a P$^+$-type semiconductor substrate (collector layer), 11 having relatively low specific resistance of 0.05 to 0.0002 Ω.cm is prepared. The collector layer 11 is provided on its one major surface with an N$^{30}$-type buffer layer 12 having relatively low specific resistance of about 0.1 Ω.cm and thickness of about 10 to 20 μm by epitaxial growth. Then, an N-type body layer 13 having relatively high specific resistance of about 20 to 30 Ω.cm and thickness of about 50 μm is formed on the N$^+$-type buffer layer 12 by epitaxial growth. Insulating films 30 of SiO$_2$ or the like are formed on the N-type body layer 13, to be patterned. The patterned insulating films 30 are employed as masks to selectively implant a P-type impurity such as boron into the N-type body layer 13 by ion implantation or the like and then thermally diffused, to thereby form relatively deep first P-type base regions 14a. Thus, the structure shown in FIG. 13A is obtained.

Arrangement of the first P-type base regions 14a is in accordance with a cell pattern of the IGBT. For example, matrix arrangement and stripe arrangement are well known in the art. It is preferable that dimensions of the arrangement are so designed as to ensure channel width per unit area of at least about 300 cm$^{-1}$.

Then the insulating films 30 are removed to be entirely replaced by SiO$_2$ films 17a of about 600 to 1000 Å in thickness, and polysilicon films 18a of several thousands Å in thickness are further formed on the same. The SiO$_2$ films 17a and the polysilicon films 18a are so patterned to define windows of prescribed patterns. A P-type impurity such as boron is selectively implanted through the windows in an amount of injection of about $2\times10^{14}$ to $5\times10^{14}$ cm$^{-2}$ by ion implantation and then thermally diffused, to thereby form relatively shallow P-type base regions 14b of about 4 to 10 μm in depth. The second P-type base regions 14b are formed around the peripheries of the first P-type base regions 14a when the same are in matrix arrangement, while being formed on both sides of the first P-type base regions 14a when the same are in stripe arrangement. Then, an N-type impurity such as phosphorus is introduced through the same windows and thermally diffused, to thereby form N$^+$-type emitter regions 15. Such a method is well known as a DSA-MOS process of constantly forming the channel length L (see FIG. 4) by double diffusion. The structure shown in FIG. 13B is attained through the above processing.

Then, unwanted parts of the SiO$_2$ films 17a and the polysilicon films 18a are removed. Remaining parts of the SiO$_2$ films 17a and the polysilicon films 18a define gate oxide films 17 and gate electrodes 18. Then, oxide films 31 are formed over the entire surfaces and patterned to remove portions thereof on the first P-type base regions 14a and the N$^+$-type emitter regions 15. Emitter electrodes 19 are formed on the surface and a collector electrode 20 is formed on the rear surface (another major surface of the P$^+$-type collector layer 11), to thereby attain the structure shown in FIG. 13C. Thus, the IGBT shown in FIG. 4 is implemented.

Figure 14:
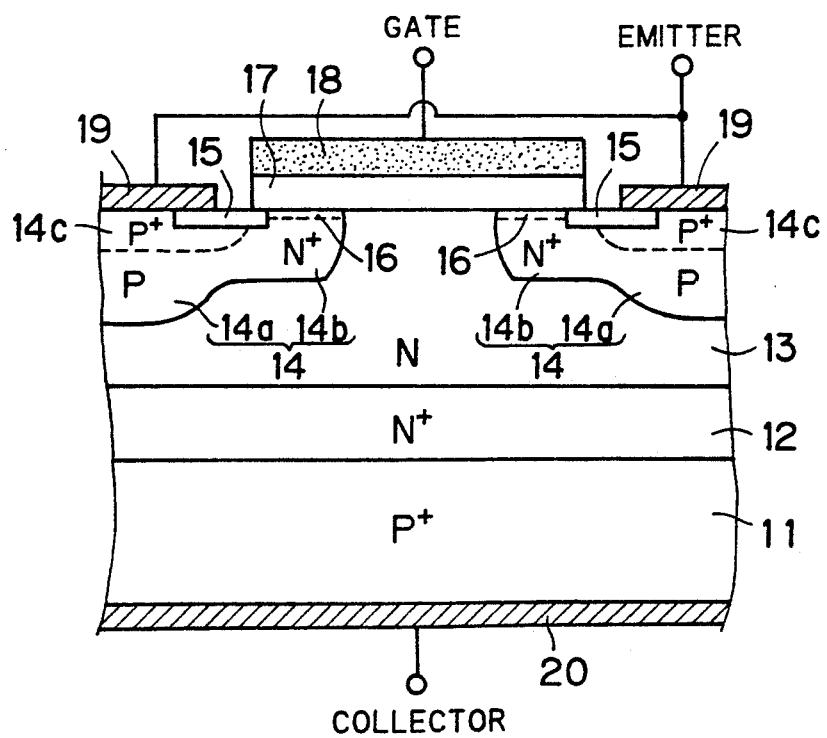
FIG. 14 is a sectional view showing the structure of another embodiment of an IGBT according to the present invention.

FIG. 14 is a sectional view showing structure of another embodiment of the IGBT in accordance with the present invention. In this embodiment, P$^+$-type regions 14c of relatively low specific resistance are formed in P-type base regions 14, as shown by dotted lines. Thus, a voltage drop caused by hole current passing through the P-type base regions 14 is so reduced that an NPN transistor formed by N-type emitter regions 15, the P-type base regions 14 and an N-type body layer 13 is hardly activated. Thus, the IGBT hardly enters latch-up. The P$^+$-type regions 14c are formed in a step after formation of second P-type base regions 14b, before the N$^+$-type emitter regions 15 are formed. In this step, windows of appropriate patterns are defined in the unpatterned SiO$_2$ film 17a and polysilicon film 18a shown in FIG. 13B, to form a mask for use in ion impletation for the P$^+$-type regions 14c. Such windows may be closed in a subsequent step of forming the N$^+$-type emitter regions 15. The P$^+$-type regions 14c are preferably set to have an amount of impurity injection of about $0.8\times10^{15}$ to $1\times10^{15}$ cm$^{-2}$ and a depth of about half that of the second P-type base regions 14b.

Although each of the above embodiments has been described with reference to an N-channel IGBT, the present invention is also applicable to a P-channel IGBT.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing an insulated gate bipolar transistor, comprising the steps of:

preparing a first conductivity type first semiconductor layer having first and second major surfaces;

forming a second conductivity type second semiconductor layer on said first major surface of said first semiconductor layer;

selectively introducing a first conductivity type impurity into said second semiconductor layer to form a relatively deep first conductivity type first semiconductor region on said second semiconductor layer;

forming an oxide film having a thickness of about 600 to 1000 Å on said second semiconductor layer and said first semiconductor region;

forming a conductor layer on said oxide film;

patterning said oxide film and said conductor layer to define a window;

introducing a first conductivity type impurity into said second semiconductor layer in an impurity dose amount of about $2 \times 10^{14}$ to $5 \times 10^{14}$ cm$^{-2}$ through said window to form a first conductivity type second semiconductor region having relatively shallow depth of about 4 to 10 $\mu$m, said first and second semiconductor regions being adjacent to each other and integrated to form a first conductivity type well region;

selectively introducing a second conductivity type impurity into said well region through said window to form a second conductivity type third semiconductor region on said well region;

selectively removing said oxide film and said conductor layer while at least leaving portions thereof on a portion of a surface of said second semiconductor region between surfaces of said third semiconductor region and said second semiconductor layer;

forming a first electrode on said third semiconductor region; and forming a second electrode on said second major surface of said first semiconductor layer.

2. A method of manufacturing an insulated gate bipolar transistor in accordance with claim 1, further comprising the steps of:

selectively removing said oxide film and said conductor layer to open a further window, after formation of said second semiconductor region; and introducing a first conductivity type impurity into said well region in impurity dose amount of about $0.8 \times 10^{15}$ to $1 \times 10^{15}$ cm$^{-2}$ through said further window to form first conductivity type fourth semiconductor region of about half depth of said second semiconductor region on a center of said well region.

* * * * *